(12) United States Patent
Yang

(10) Patent No.: US 11,719,730 B2
(45) Date of Patent: Aug. 8, 2023

(54) TEST METHOD AND DEVICE FOR CONTACT RESISTOR

(71) Applicant: CHANGXIN MEMORY TECHNOLOGIES, INC., Hefei (CN)

(72) Inventor: Haiyang Yang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 231 days.

(21) Appl. No.: 17/389,581

(22) Filed: Jul. 30, 2021

(65) Prior Publication Data

US 2022/0146560 A1     May 12, 2022

Related U.S. Application Data

(63) Continuation of application No. PCT/CN2021/095588, filed on May 24, 2021.

(30) Foreign Application Priority Data

Nov. 9, 2020    (CN) .......................... 202011241123.6

(51) Int. Cl.
    *G01R 27/02*         (2006.01)
    *G01R 27/20*         (2006.01)
    *G01R 31/26*         (2020.01)
    *H03K 17/687*       (2006.01)

(52) U.S. Cl.
    CPC ......... *G01R 27/02* (2013.01); *G01R 31/2621* (2013.01); *G01R 27/205* (2013.01); *H03K 17/687* (2013.01)

(58) Field of Classification Search
    CPC ........ G01R 27/00; G01R 27/02; G01R 27/20; G01R 27/205; G01R 31/00; G01R 31/26; G01R 31/2607; G01R 31/2621; G01R 31/2628; G01R 31/27; H03K 17/00; H03K 17/51; H03K 17/56; H03K 17/687
    USPC ......................................... 324/600, 649, 691
    See application file for complete search history.

(56) References Cited

U.S. PATENT DOCUMENTS

| | | | |
|---|---|---|---|
| 5,879,968 A | 3/1999 | Kinzer | |
| 6,207,974 B1 | 3/2001 | Kinzer | |
| 7,312,509 B2 | 12/2007 | Han | |
| 7,592,862 B2 | 9/2009 | Han | |
| 9,322,840 B2 | 4/2016 | Ausserlechner | |
| 9,768,085 B1* | 9/2017 | Cheng | H01L 29/66795 |
| 10,247,788 B2 | 4/2019 | Ausserlechner | |
| 2006/0138582 A1* | 6/2006 | Han | G01K 7/226 257/467 |

(Continued)

FOREIGN PATENT DOCUMENTS

| | | | | |
|---|---|---|---|---|
| CN | 2304130 Y | * | 1/1999 | ............. G01R 27/14 |
| CN | 101162718 A | | 4/2008 | |

(Continued)

*Primary Examiner* — Hoai-An D. Nguyen
(74) *Attorney, Agent, or Firm* — Cooper Legal Group, LLC

(57) ABSTRACT

A test method and device for a contact resistor are provided, configured to test a contact resistor of a metal-oxide-semiconductor (MOS) transistor. The method includes: a resistance value per area and a temperature coefficient of resistance of the contact resistor are acquired; and a target resistance value of the contact resistor is determined according to the resistance value per area, the temperature coefficient of resistance, and an area of the contact resistor.

14 Claims, 4 Drawing Sheets

A resistance value per area of a contact resistor is acquired — S201

A temperature coefficient of resistance of the contact resistor is acquired — S202

A target resistance value of the contact resistor is determined according to the resistance value per area, the TCR, and an area of the contact resistor — S203

(56) References Cited

U.S. PATENT DOCUMENTS

| | | |
|---|---|---|
| 2008/0061868 A1 | 3/2008 | Han |
| 2008/0093706 A1 | 4/2008 | Sato |
| 2015/0002145 A1 | 1/2015 | Ausserlechner |
| 2016/0245880 A1 | 8/2016 | Ausserlechner |
| 2020/0152781 A1 | 5/2020 | Manipatruni et al. |
| 2022/0373584 A1* | 11/2022 | Lin .................... G01R 27/205 |

FOREIGN PATENT DOCUMENTS

| | | | |
|---|---|---|---|
| CN | 109427677 A | | 3/2019 |
| CN | 111095564 A | | 5/2020 |
| CN | 111106093 A | | 5/2020 |
| CN | 115372775 A | * 11/2022 | ........... G01R 27/205 |
| JP | H10270572 A | | 10/1998 |
| JP | H11204609 A | | 7/1999 |
| JP | 2013201357 A | * 10/2013 | ............. H01L 27/04 |

* cited by examiner

TEST METHOD AND DEVICE FOR CONTACT RESISTOR

CROSS-REFERENCE TO RELATED APPLICATIONS

This application is a continuation of International patent application No. PCT/CN2021/095588, filed on May 24, 2021, which is filed based upon and claims priority to Chinese patent application No. 202011241123.6, filed on Nov. 9, 2020. The contents of International patent application No. PCT/CN2021/095588 and Chinese patent application No. 202011241123.6 are incorporated herein by reference in their entireties.

TECHNICAL FIELD

The disclosure relates to the technical field of semiconductors, and in particular to a test method and device for a contact resistor.

BACKGROUND

A metal-oxide-semiconductor field-effect transistor (MOSFET), also called a MOS transistor, is the most basic element in the manufacturing process of semiconductor components and has been widely applied to various integrated circuits.

In the process of preparing MOS transistors, it is usually necessary to test the reliability of the MOS transistors, such as testing its contact resistor. However, in an actual test process, since the resistance value of the contact resistor will change with the change of an environment temperature, it is difficult to maintain the resistance value at a fixed value, which will have a greater impact on the test precision of an entire MOS transistor.

SUMMARY

In a first aspect, an embodiment of the disclosure provides a test method for a contact resistor, which is configured to test a contact resistor of a MOS transistor and includes: acquiring a resistance value per area of the contact resistor; acquiring a temperature coefficient of resistance of the contact resistor; and determining a target resistance value of the contact resistor according to the resistance value per area, the temperature coefficient of resistance, and an area of the contact resistor.

In a second aspect, an embodiment of the disclosure provides a test device for a contact resistor, configured to test a contact resistor of a MOS transistor. The test device includes a processor and a memory configured to store instructions executable by the processor. The processor is configured to: acquire a resistance value per area of the contact resistor and acquire a temperature coefficient of resistance of the contact resistor; and determine a target resistance value of the contact resistor according to the resistance value per area, the temperature coefficient of resistance, and an area of the contact resistor.

BRIEF DESCRIPTION OF THE DRAWINGS

In order to more clearly illustrate the technical solution in the embodiment of the present application or the related art, the accompanying drawings needed in description of the embodiments or the related art are simply introduced below. It is apparent that the accompanying drawings in the following description are some embodiments of the present application, for the ordinary skill in the art, some other accompanying drawings can also be obtained according to these without creative effort.

DETAILED DESCRIPTION

In order to make the objectives, technical solutions and advantages of embodiments of the disclosure clearer, the technical solutions in the embodiments of the disclosure will be described clearly and completely below in combination with the drawings in the embodiments of the disclosure. Apparently, the embodiments described are part of the embodiments of the disclosure, not all the embodiments. Based on the embodiments in disclosure, all other embodiments obtained by those skilled in the art without creative effort shall fall within the protection scope of the disclosure.

In related integrated circuit manufacturing, with continuous improvement of a semiconductor integrated circuit technology and continuous decrease of the feature size, the quantity of components on a single wafer is continuously increased, and circuit functions are improved. Since the link requirements in manufacturing are finer and finer, the reliability of the components is increasingly significant.

Figure 1:
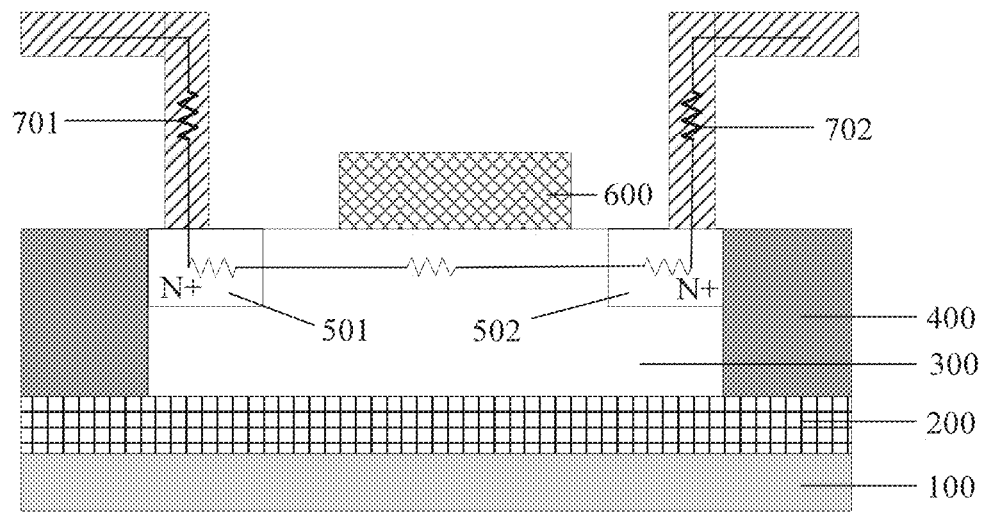
FIG. 1 is a schematic structure diagram of a semiconductor component provided by an embodiment of the disclosure.

A metal-oxide-semiconductor field-effect transistor (MOSFET) transistor is also called a MOS transistor. The MOS transistor is the most basic element in a semiconductor component manufacturing process, and has been widely applied to various integrated circuits. Referring to FIG. 1, FIG. 1 is a schematic structure diagram of a semiconductor component provided by an embodiment of the disclosure. In FIG. 1, the semiconductor component is formed based on a MOS transistor, which specifically includes: a P-substrate 100 (Psub for short), a deep n-well (DNW) structure 200, a P-well structure 300 (PWell for short), a shallow trench isolation (STI) structure 400, an N+ injection region 501, an N+ injection region 502, a polycrystalline silicon structure 600 (poly for short), a first contact resistor 701, and a second contact resistor 702.

The N+ injection region 501 and the N+ injection region 502 are sunken into the P-well structure 300. The first contact resistor 701 is located above the N+ injection region 501, and forms Ohm contact with the N+ injection region 501. The second contact resistor 702 is located above the N+ injection region 502, and forms Ohm contact with the N+ injection region 502.

The N+ injection region 501 forms a source electrode region of the MOS transistor, the N+ injection region 502 forms a drain electrode region of the MOS transistor, and the polycrystalline silicon structure 600 forms a gate electrode region of the MOS transistor.

In some embodiments, when the MOS transistor is tested, a region composed of the source electrode, the drain electrode and the gate electrode of the MOS transistor may be tested based on a BSIM4 test model. The BSIM4 test model is a physically based software simulation system configured to test a circuit simulation and CMOS technology and having the characteristics of accuracy, upgradability, robustness, linguistic feature and the like, and may provide direct current analysis data, transient analysis data, alternating current analysis data and other data of a standard circuit.

In some embodiments, when the MOS transistor is tested based on the above-mentioned BSIM4 test model, a resistance value of a contact resistor of the MOS transistor needs to be added in the test model. The contact resistor of the MOS transistor is used as an important element of the MOS transistor, the size of the resistance value is of great importance in the electrical characteristics of the MOS transistor. Since the resistance value of the contact resistor may change with the change of the environment temperature, there may be a relatively large error in the test precision of the whole MOS transistor.

In order to solve the above-mentioned technical problem, the embodiments of the disclosure provide a test method for a contact resistor. When the contact resistor of the MOS transistor is tested, a measurement result of the contact resistor is corrected according to a temperature coefficient of resistance of the contact resistor, so that the influence of the environment temperature on the measurement result of the contact resistor can be effectively eliminated, and the measurement precision of the MOS transistor can be improved. Specific implementation can refer to the descriptions in the following embodiments.

Figure 2:
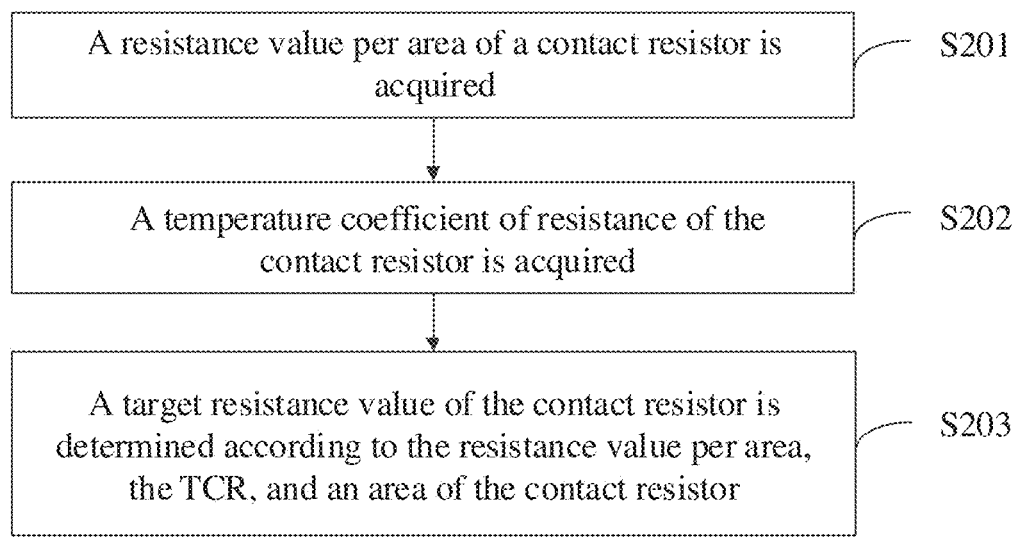
FIG. 2 is a flowchart of a test method for a contact resistor provided by an embodiment of the disclosure.

Referring to FIG. 2, FIG. 2 is a flowchart of a test method for a contact resistor provided by an embodiment of the disclosure. In a feasible embodiment of the disclosure, the test method for the contact resistor includes the following operations.

At S201, a resistance value per area of the contact resistor is acquired.

It can be understood that under a condition that a temperature is fixed, a resistance value R of a conventional material is in direct proportion to a length L of the material and in inverse proportion to an area S of the material, which is usually expressed as: $R=\rho L/S$, where $\rho$ represents the resistivity of the material.

In some embodiments, the resistance value per area of the contact resistor can be understood as a resistance value generated by the contact resistor within each unit area.

At S202, a temperature coefficient of resistance of the contact resistor is acquired.

In a semiconductor structure, the resistance value of the contact resistor has a linear relationship with the temperature of an environment that the contact resistor is located in. The above-mentioned temperature coefficient of resistance (TCR) may be configured to indicate the relationship between the resistance value of the contact resistor and the temperature of the environment that the contact resistor is located in. For example, it can be configured to express a relative variable of the resistance value of the contact resistor when the temperature of the environment that the contact resistor is located in changes by 1 degree centigrade, the unit of which is ppm/° C.

Since the TCR is not constant but is a value changing with the change of the temperature, the TCR will usually decrease as the temperature increases. Therefore, in the present embodiment, the acquiring the TCR of the above-mentioned contact resistor includes: acquiring the TCR of the contact resistor at the temperature of the present environment.

At S203, a target resistance value of the contact resistor is determined according to the resistance value per area, the TCR, and an area of the contact resistor.

In the embodiments of the disclosure, after the resistance value per area of the contact resistor and the TCR at the temperature of the present environment are determined, the target resistance value of the contact resistor can be calculated according to the above-mentioned resistance value per area, the TCR and the area of the contact resistor.

It can be understood that the TCR of the contact resistor at the temperature of the present environment is introduced into the target resistance value calculated in the embodiments of the disclosure, so that the influence of the temperature on the measurement result of the contact resistor can be effectively eliminated, and an error between the calculated target resistance value and an actual resistance value of the contact resistor is effectively reduced. Therefore, the measurement accuracy of the MOS transistor can be effectively improved after the above-mentioned target resistance value is input into a measurement model of the MOS transistor.

It should be noted that the above-mentioned contact resistor includes a first contact resistor 701 and a second contact resistor 702 in FIG. 1. By means of the above-mentioned embodiments, the target resistance values corresponding to the first contact resistor 701 and the second contact resistor 702 can be respectively acquired.

According to the test method for the contact resistor provided by the embodiments of the disclosure, in the testing process, a measurement result of the contact resistor can be corrected according to the TCR of the contact resistor, thereby effectively eliminating the influence of the environment temperature on the measurement result of the contact resistor and improving the measurement accuracy of the MOS transistor.

Figure 3:
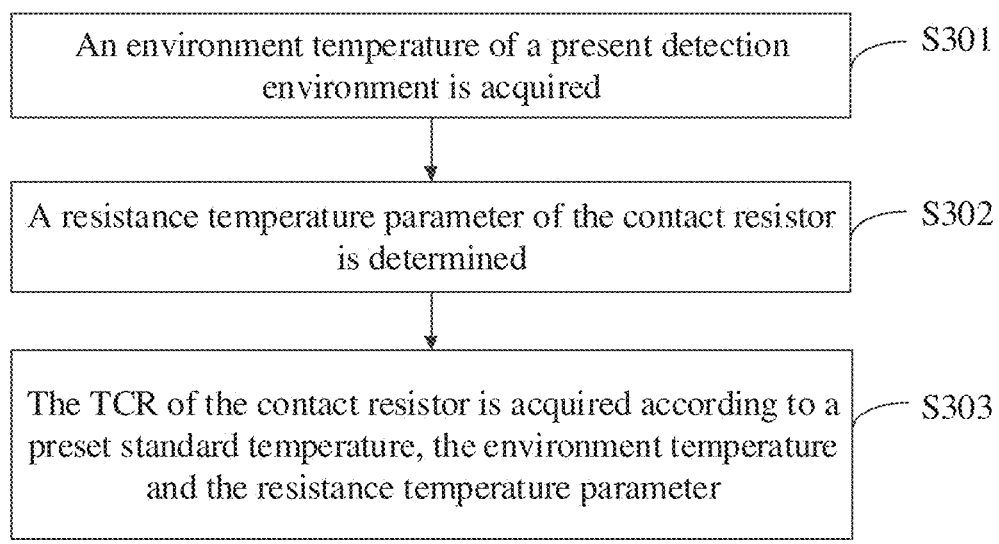
FIG. 3 is a sub flowchart of a test method for a contact resistor provided by an embodiment of the disclosure.

Based on the contents described in the above-mentioned embodiments, referring to FIG. 3, FIG. 3 is a sub flowchart of a test method for a contact resistor provided by an embodiment of the disclosure. In a feasible embodiment of the disclosure, operation S202 in the above-mentioned embodiment that the TCR of the contact resistor is acquired specifically includes as follows.

At S301, an environment temperature of a present detection environment is acquired.

At S302, a resistance temperature parameter of the contact resistor is determined.

At S303, the TCR of the contact resistor is acquired according to a preset standard temperature, the environment temperature and the resistance temperature parameter.

In some instances, some conventional temperature measuring methods can be configured to detect the environment temperature of the present test environment.

In some cases, the resistance temperature parameter of the above-mentioned contact resistor includes a first resistance temperature parameter and a second resistance temperature parameter. The resistance temperature parameter of the above-mentioned contact resistor can be determined by the following mode.

Resistance values of the contact resistor corresponding to a plurality of preset sampling temperatures are acquired; and the first resistance temperature parameter and the second resistance temperature parameter are determined according to the respective sampling temperatures and the resistance values of the contact resistor corresponding to the respective sampling temperatures.

In some embodiments, if tc1rcon represents the first resistance temperature parameter, tc2rcon represents the second resistance temperature parameter, and tx represents the sampling temperature, a relationship between the resistance value R of the contact resistor and the tc1rcon, tc2ron and tx may be expressed by one two-variable n-power function. For example:

$R=tc1rcon*tx+tc2rcon*tx2+C$, where $C$ is a preset coefficient.

In a feasible embodiment, several sampling temperature values may be randomly selected within a certain temperature range, and real resistance values of the contact resistor at the respective sampling temperature values are measured; the respective sampling temperature values and the resistance values of the contact resistor at the respective sampling temperatures are respectively input into the two-variable n-power function, that is, several points can be acquired in a coordinate system; and curve fitting is performed to obtain optimal values of the first resistance temperature parameter tc1rcon and the second resistance temperature parameter tc2rcon.

In some cases, the curve fitting is performed on the two-variable n-power function by using the least square method, or by using matlab software. The embodiments of the disclosure do not limit a specific curve fitting method.

In some embodiments, after the resistance temperature parameter of the contact resistor is determined, the TCR of the contact resistor can be acquired according to the resistance temperature parameter, the preset standard temperature and the environment temperature of the present test environment.

In some cases, the TCR of the contact resistor may be acquired by means of a following mode:

$rconfet\_temper=1+(temper-tnom)*(tc1rcon+tc2rcon*(temper-tnom))$;

where rconfet_temper represents the TCR; temper represents the environment temperature; tnom represents the standard temperature; tc1rcon represents the first resistance temperature parameter; and tc2rcon represents the second resistance temperature parameter.

The above-mentioned standard temperature is set to standardize measurement conditions to allow comparison between different groups of data. An internationally recognized value quoted by many measurement models may be used. For example, the melting temperature of ice, i.e., the condensation point of water, is 0° C. (273.15K).

According to the test method for the contact resistor provided by the embodiments of the disclosure, after the environment temperature of the present detection environment is detected and the resistance temperature parameter of the contact resistor is acquired by means of curve fitting, the TCR of the contact resistor under the present detection environment can be calculated and acquired according to the preset standard temperature, the environment temperature of the present detection environment and the above-mentioned resistance temperature parameter, and then in the subsequent resistance value measurement process, the measurement result of the contact resistor can be corrected according to the TCR to improve the measurement accuracy of the contact resistor and then improve the measurement precision of the MOS transistor.

Based on the contents described in the above-mentioned embodiments, in the test method for the contact resistor provided by the embodiments of the disclosure, after the TCR of the contact resistor is determined, the target resistance value of the contact resistor can be calculated according to the resistance value per area of the contact resistor, the TCR and the area of the contact resistor.

In some embodiments, the first target resistance value of the first contact resistor is determined by means of a following mode:

$rdc=rconfet*rconfet\_temper*1/S1$; and the second target resistance value of the second contact resistor is determined by means of a following mode:

$rsc=rconfet*rconfet\_temper*1/S2$;

where rdc represents the first target resistance value; rsc represents the second target resistance value; rconfet represents the resistance value per area; rconfet_temper represents the TCR; S1 represents the area of the first contact resistor; and S2 represents the area of the second contact resistor.

According to the test method for the contact resistor provided by the embodiments of the disclosure, in the testing process, the measurement result of the contact resistor can be corrected according to the TCR of the contact resistor, thereby effectively eliminating the influence of the environment temperature on the measurement result of the contact resistor and improving the measurement accuracy of the contact resistor.

Figure 4:
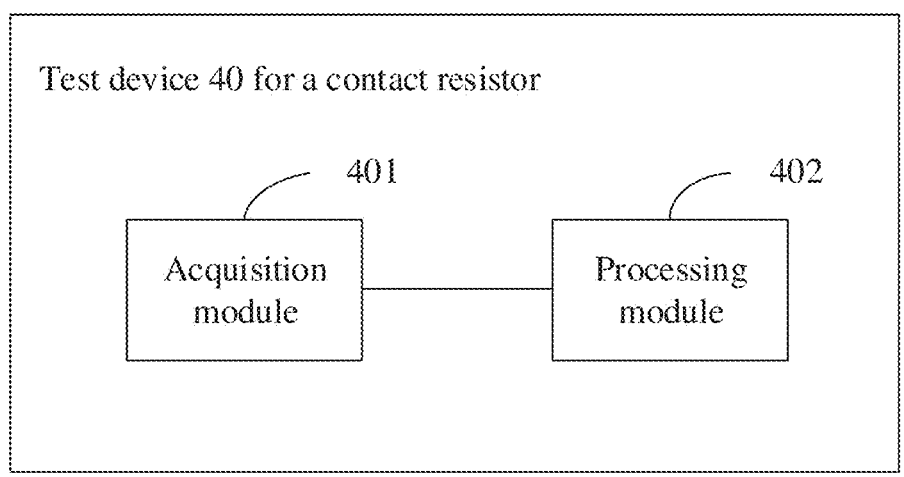
FIG. 4 is a schematic diagram of a program module in a test device for a contact resistor provided by an embodiment of the disclosure.

Based on the contents described in the above-mentioned embodiments, the embodiments of the disclosure further provide a test device for a contact resistor, configured to test a contact resistor of a MOS transistor. Referring to FIG. 4, FIG. 4 is a schematic diagram of a program module of a test device for a contact resistor provided by an embodiment of the disclosure.

In a feasible embodiment of the disclosure, the test device 40 for a contact resistor includes: an acquisition module 401 and a processing module 402.

The acquisition module 401 is configured to acquire a resistance value per area of the contact resistor and acquire a temperature coefficient of resistance (TCR) of the contact resistor;

The processing module 402 is configured to determine a target resistance value of the contact resistor according to the resistance value per area, the TCR, and an area of the contact resistor.

The test device 40 for the contact resistor provided by the embodiments of the disclosure can be configured to test the contact resistor of the MOS transistor. In the testing process, a measurement result of the contact resistor can be corrected according to the TCR of the contact resistor, thereby effectively eliminating the influence of the environment temperature on the measurement result of the contact resistor and improving the measurement accuracy of the MOS transistor.

In a feasible embodiment, the contact resistor includes a first contact resistor and a second contact resistor; the first contact resistor is coupled to a source electrode of the MOS transistor; and the second contact resistor is coupled to a drain electrode of the MOS transistor.

In a feasible embodiment, the acquisition module 401 is configured to: acquire an environment temperature of a present detection environment; determine a resistance temperature parameter of the contact resistor; and acquire the TCR of the contact resistor according to a preset standard temperature, the environment temperature and the resistance temperature parameter.

In a feasible embodiment, the resistance temperature parameter includes a first resistance temperature parameter and a second resistance temperature parameter; and the acquisition module 401 is configured to: acquire resistance values of the contact resistor corresponding to a plurality of preset sampling temperatures; and determine the first resistance temperature parameter and the second resistance temperature parameter according to the respective sampling temperatures and the resistance values of the contact resistor corresponding to the respective sampling temperatures.

In a feasible embodiment, the acquisition module 401 is configured to acquire the TCR of the contact resistor by means of a following mode:

$$rconfet\_temper=1+(temper-tnom)*(tc1rcon+tc2rcon*(temper-tnom));$$

where rconfet_temper represents the TCR; temper represents the environment temperature; tnom represents the standard temperature; tc1rcon represents the first resistance temperature parameter; and tc2rcon represents the second resistance temperature parameter.

In a feasible embodiment, the processing module 402 is configured to: determine a first target resistance value of the first contact resistor according to the resistance value per area, the TCR, and an area of the first contact resistor; and determine a second target resistance value of the second contact resistor according to the resistance value per area, the TCR and an area of the second contact resistor.

In a feasible embodiment, the processing module 402 is configured to:

determine the first target resistance value by means of a following mode:

$$rdc=rconfet*rconfet\_temper*1/S1; \text{ and}$$

determine the second target resistance value by means of a following mode:

$$rsc=rconfet*rconfet\_temper*1/S2;$$

where rdc represents the first target resistance value; rsc represents the second target resistance value; rconfet represents the resistance value per area; rconfet_temper represents the TCR; S1 represents the area of the first contact resistor; and S2 represents the area of the second contact resistor.

It can be understood that functions realized by all the functional modules in the test device 40 for a contact resistor correspond to all the steps in the test method for a contact resistor described in the above-mentioned embodiments, so that the detailed realizing processes of all the functional modules in the test device 40 for a contact resistor can refer to all the steps in the test method for a contact resistor described in the above-mentioned embodiments, which is not repeated here.

Furthermore, based on the contents described in the above-mentioned embodiments, the embodiments of the disclosure further provide a computer-readable storage medium. The computer-readable storage medium stores computer executable instructions. A processor executes the computer executable instructions to realize all the steps in the test method for a contact resistor described in the above-mentioned embodiments.

In the several embodiments provided by the disclosure, it should be understood that the disclosed device and methods may be implemented in other manners. For example, the device embodiment described above is merely illustrative. For example, the division of the module is only a logical function division. In actual implementation, there may be another division manner. For example, a plurality of modules may be combined, or integrated into another system, or some features may be ignored or not executed. From another point of view, the mutual coupling or direct coupling or communication connection shown or discussed may be indirect coupling or communication connection through some interfaces, apparatuses or modules, and may be in electrical, mechanical or other forms.

The modules described as separate components may or may not be physically separated, and the components displayed as modules may or may not be physical units, that is, they may be located in one place, or they may be distributed on multiple network units. Some or all of the modules may be selected according to actual needs to achieve the objectives of the solutions of the embodiments.

In addition, all the functional modules in all the embodiments of the disclosure can be integrated into one processing unit, or each module can physically exist alone, or two or more units can be integrated in one unit. The above integrated units can be implemented in the form of hardware, or can be implemented in the form of hardware and software functional units.

The above-mentioned integrated modules implemented in the form of software functional modules may be stored in one computer-readable storage medium. The above-mentioned software function module is stored in one storage medium and includes several instructions to make a computer device (which may be a personal computer, a server, a network device, or the like) or a processor execute part of the steps in the methods of the various embodiments of the disclosure.

It should be understood that the above processor may be a central processing unit (CPU), or other general-purpose processors, a digital signal processor (DSP), an application specific integrated circuits (ASIC), and the like. The general-purpose processor may be a microprocessor, or the processor may also be any conventional processor or the like. The steps of the method disclosed in conjunction with the application may be directly embodied as being executed by a hardware processor, or may be executed and completed by a combination of hardware and software modules in the processor.

The memory may include a high-speed random access memory (RAM), and may also include a non-volatile memory (NVM), such as at least one disk memory, and may also be a USB flash disk, a mobile hard disk, a read-only memory, a magnetic disk, an optical disk or the like.

The bus may be an industry standard architecture (ISA) bus, a peripheral component interconnection (PCI) bus, or an extended industry standard architecture (EISA) bus, and the like. The bus may be divided into an address bus, a data bus, a control bus, and the like. For ease of representation, the buses in the drawings of the disclosure are not limited to only one bus or one type of bus.

The storage medium may be implemented by any type of volatile or non-volatile storage devices or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or an optical disk. The storage medium may be any available medium that can be accessed by a general-purpose or special-purpose computer.

An exemplary storage medium is coupled to the processor, so that the processor can read information from the storage medium and can write information to the storage medium. Of course, the storage medium may also be a constituent part of the processor. The processor and the storage medium may be located in an ASIC. Of course, the processor and the storage medium may also exist as discrete components in an electronic device or a main control device.

Those skilled in the art can understand that all or part of the steps in the above method embodiments can be implemented by program instructions related hardware. The aforementioned program can be stored in one computer-readable storage medium. The program, when being executed, executes the steps of the above method embodiments; and the above storage medium includes: an ROM, an RAM, a magnetic disk, or an optical disk and other media that can store program codes.

It should be finally noted that the various above embodiments are only configured to describe the technical solutions of the disclosure, and not intended to limit the disclosure. Although the disclosure has been described in detail with reference to the above embodiments, those ordinarily skilled in the art should understand that they can still modify the technical solutions described in all the above embodiments, or equivalently replace some or all of the technical features, and these modifications or replacements do not depart the essences of the corresponding technical solutions from the spirit and scope of the technical solutions of all the embodiments of the disclosure.

The invention claimed is:

1. A test method for a contact resistor, configured to test a contact resistor of a metal-oxide-semiconductor field-effect transistor (MOSFET), comprising:
   acquiring a resistance value per area of the contact resistor;
   acquiring a temperature coefficient of resistance of the contact resistor; and
   determining a target resistance value of the contact resistor according to the resistance value per area, the temperature coefficient of resistance, and an area of the contact resistor.

2. The method of claim 1, wherein the contact resistor comprises a first contact resistor and a second contact resistor; the first contact resistor is coupled to a source electrode of the MOSFET; and the second contact resistor is coupled to a drain electrode of the MOSFET.

3. The method of claim 2, wherein acquiring the temperature coefficient of resistance of the contact resistor comprises:
   acquiring an environment temperature of a present detection environment;
   determining a resistance temperature parameter of the contact resistor; and
   acquiring the temperature coefficient of resistance of the contact resistor according to a preset standard temperature, the environment temperature and the resistance temperature parameter.

4. The method of claim 3, wherein the resistance temperature parameter comprises a first resistance temperature parameter and a second resistance temperature parameter; and determining the resistance temperature parameter of the contact resistor comprises:
   acquiring resistance values of the contact resistor corresponding to a plurality of preset sampling temperatures; and
   determining the first resistance temperature parameter and the second resistance temperature parameter according to the respective sampling temperatures and the resistance values of the contact resistor corresponding to the respective sampling temperatures.

5. The method of claim 4, wherein acquiring the temperature coefficient of resistance of the contact resistor according to the preset standard temperature, the environment temperature and the resistance temperature parameter comprises:
   acquiring the temperature coefficient of resistance of the contact resistor by means of a following mode:

$$rconfet\_temper = 1 + (temper - tnom) * (tc1rcon + tc2rcon * (temper - tnom));$$

where rconfet_temper represents the temperature coefficient of resistance, temper represents the environment temperature, tnom represents the preset standard temperature, tc1rcon represents the first resistance temperature parameter, and tc2rcon represents the second resistance temperature parameter.

6. The method of claim 2, wherein determining the target resistance value of the contact resistor according to the resistance value per area, the temperature coefficient of resistance, and the area of the contact resistor comprises:
   determining a first target resistance value of the first contact resistor according to the resistance value per area, the temperature coefficient of resistance, and an area of the first contact resistor; and
   determining a second target resistance value of the second contact resistor according to the resistance value per area, the temperature coefficient of resistance, and an area of the second contact resistor.

7. The method of claim 6, wherein determining the first target resistance value of the first contact resistor according to the resistance value per area, the temperature coefficient of resistance, and the area of the first contact resistor comprises:
   determining the first target resistance value by means of a following mode:

$$rdc = rconfet * rconfet\_temper * 1/S1;\ \text{and}$$

determining the second target resistance value of the second contact resistor according to the resistance value per area, the temperature coefficient of resistance, and the area of the second contact resistor comprises:
   determining the second target resistance value by means of a following mode:

$$rsc = rconfet * rconfet\_temper * 1/S2;$$

where rdc represents the first target resistance value, rsc represents the second target resistance value, rconfet represents the resistance value per area, rconfet_temper represents the temperature coefficient of resistance, S1 represents the area of the first contact resistor, and S2 represents the area of the second contact resistor.

8. A test device for a contact resistor, configured to test a contact resistor of a metal-oxide-semiconductor field-effect transistor (MOSFET), comprising:
   a processor; and
   a memory configured to store instructions executable by the processor;
   wherein the processor is configured to:
   acquire a resistance value per area of the contact resistor, and acquire a temperature coefficient of resistance of the contact resistor; and
   determine a target resistance value of the contact resistor according to the resistance value per area, the temperature coefficient of resistance, and an area of the contact resistor.

9. The device of claim 8, wherein the contact resistor comprises a first contact resistor and a second contact resistor; the first contact resistor is coupled to a source electrode of the MOSFET; and the second contact resistor is coupled to a drain electrode of the MOSFET.

10. The device of claim 9, wherein the processor is configured to:
    acquire an environment temperature of a present detection environment;
    determine a resistance temperature parameter of the contact resistor; and acquire the temperature coefficient of resistance of the contact resistor according to a preset standard temperature, the environment temperature and the resistance temperature parameter.

11. The device of claim 10, wherein the resistance temperature parameter comprises a first resistance temperature parameter and a second resistance temperature parameter; and the processor is configured to:
acquire resistance values of the contact resistor corresponding to a plurality of preset sampling temperatures; and
determine the first resistance temperature parameter and the second resistance temperature parameter according to the respective sampling temperatures and the resistance values of the contact resistor corresponding to the respective sampling temperatures.

12. The device of claim 11, wherein the processor is configured to acquire the temperature coefficient of resistance of the contact resistor by means of a following mode:

$$rconfet\_temper = 1+(temper-tnom)*(tc1rcon+tc2rcon*(temper-tnom));$$

where rconfet_temper represents the temperature coefficient of resistance, temper represents the environment temperature, tnom represents the preset standard temperature, tc1rcon represents the first resistance temperature parameter, and tc2rcon represents the second resistance temperature parameter.

13. The device of claim 9, wherein the processor is configured to:
determine a first target resistance value of the first contact resistor according to the resistance value per area, the temperature coefficient of resistance, and an area of the first contact resistor; and
determine a second target resistance value of the second contact resistor according to the resistance value per area, the temperature coefficient of resistance, and an area of the second contact resistor.

14. The device of claim 13, wherein the processor is configured to:
determine the first target resistance value by means of a following mode:

$$rdc = rconfet*rconfet\_temper*1/S1; \text{ and}$$

determine the second target resistance value by means of a following mode:

$$rsc = rconfet*rconfet\_temper*1/S2;$$

where rdc represents the first target resistance value, rsc represents the second target resistance value, rconfet represents the resistance value per area, rconfet_temper represents the temperature coefficient of resistance, S1 represents the area of the first contact resistor, and S2 represents the area of the second contact resistor.

* * * * *